United States Patent [19]

Uchida

[11] Patent Number: 4,484,209

[45] Date of Patent: Nov. 20, 1984

[54] SOS MOSFET WITH THINNED CHANNEL CONTACT REGION

[75] Inventor: Yukimasa Uchida, Yokohama, Japan

[73] Assignee: Tokyo Shibaura Denki Kabushiki Kaisha, Japan

[21] Appl. No.: 313,338

[22] Filed: Oct. 20, 1981

[30] Foreign Application Priority Data

Dec. 12, 1980 [JP] Japan ............................... 55-175304

[51] Int. Cl.³ ...................... H01L 29/78; H01L 27/02
[52] U.S. Cl. ......................................... 357/23; 357/42
[58] Field of Search .................... 357/23 TF, 23.7 TF, 357/42

[56] References Cited

U.S. PATENT DOCUMENTS 4,106,045 8/1978 Nishi ............................... 357/23 TF
4,395,726 7/1983 Maeguchi ....................... 357/23 TF

FOREIGN PATENT DOCUMENTS 51-147186 12/1976 Japan .
55-18052 5/1980 Japan .............................. 357/23 TF
55-71068 5/1980 Japan .............................. 357/23 TF
1224335 3/1971 United Kingdom .
1561903 3/1980 United Kingdom .

OTHER PUBLICATIONS

"Sapphire Brings Out the Best in C-MOS," S. Eaton, Electronics, 6-12-75, pp. 115-118.
"Process Refinements Bring C-MOS on Sapphire Into Commercial Use," A. Capell et al., Electronics, 5-26-77, pp. 99-105.

Primary Examiner—Andrew J. James
Assistant Examiner—John Lamont
Attorney, Agent, or Firm—Finnegan, Henderson, Farabow, Garrett & Dunner

[57] ABSTRACT

A MOS type semiconductor device formed on an insulating layer and having a substrate electrode. A first semiconductor layer for forming a MOS type element is formed on the insulating layer and has a substrate region where a channel is to be formed. To this substrate region is connected a second semiconductor layer which is thinner than the first semiconductor layer and which has the same conductivity type as that of the substrate region where the channel is to be formed.

17 Claims, 20 Drawing Figures

F I G. 8
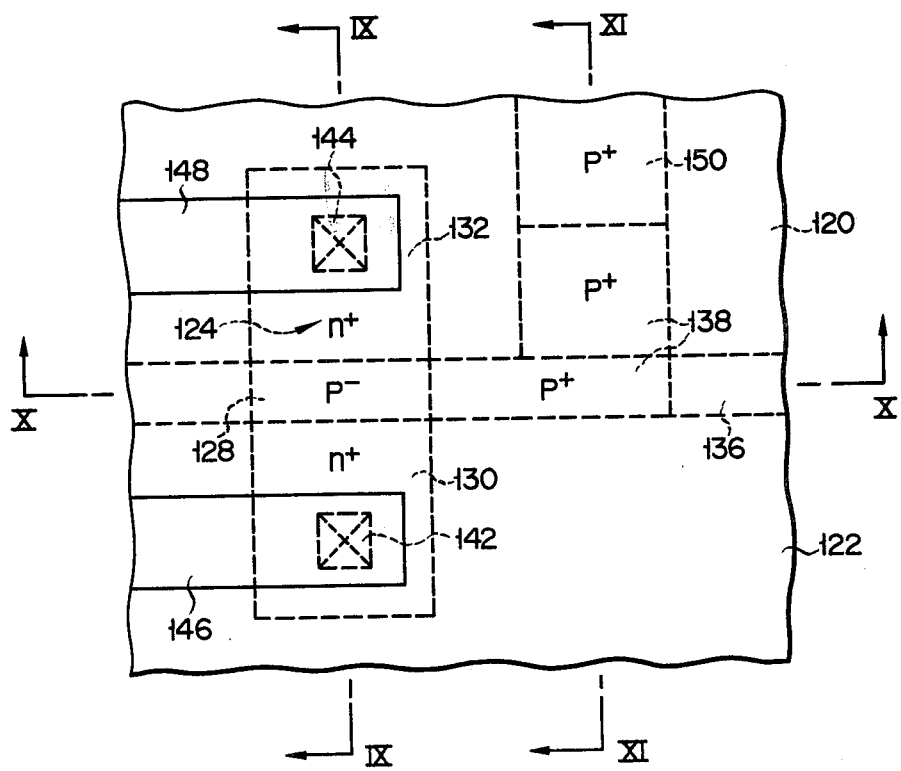

F I G. 12A
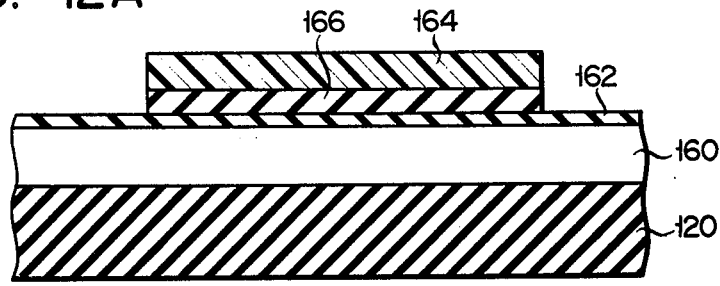
F I G. 12B
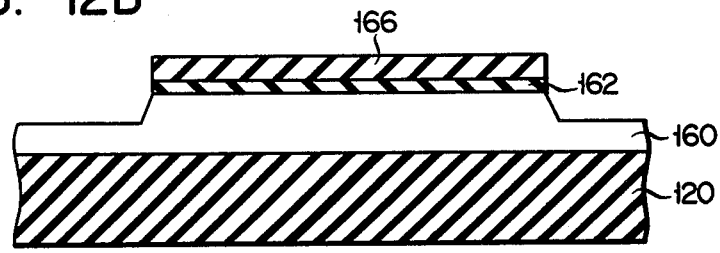
F I G. 12C
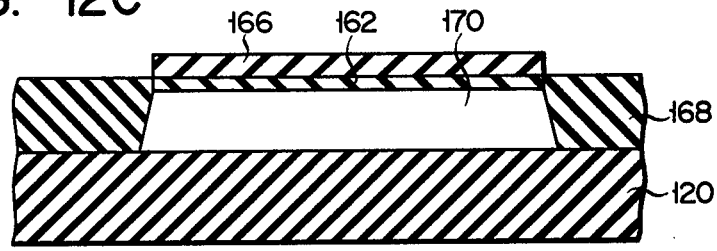
F I G. 12D
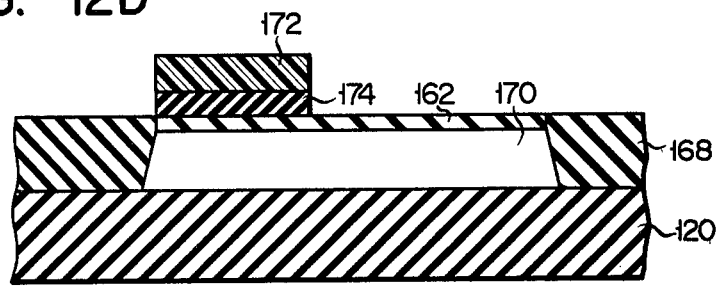

SOS MOSFET WITH THINNED CHANNEL CONTACT REGION

BACKGROUND OF THE INVENTION

The present invention relates to a MOS type semiconductor device and a method for manufacturing the same.

In order to operate a MOS.LSI at high speed or to improve the packaging density, it is advantageous to form a MOS transistor on an insulating substrate consisting of, for example, sapphire or spinel. This type of MOS semiconductor device is generally used as a MOS.LSI of SOS structure according to which a MOS transistor is formed on a silicon layer which is, in turn, formed on a sapphire substrate. FIG. 1 is a plan view of a p-channel transistor of a MOS.LSI of SOS structure, and FIG. 2 is a sectional view along the line II—II of FIG. 1. On a sapphire substrate 20 is formed a silicon layer which is completely covered by a field insulator film 22 for insulation. This silicon layer consists of an element region 24 and p+-type diffusion wiring layers 26a and 26b extending at the end of this element region 24 along the direction of the channel length. In the element region 24 are formed a p+-type source region 30 and a p+-type drain region 32 with an n−-type substrate region 28 interposed therebetween, in which the channel is to be formed. The source region 30 is connected to the p+-type diffusion wiring layer 26a, and the drain region 32 is connected to the p+-type diffusion wiring layer 26b. A gate electrode 36 is formed on the substrate region 28 with a gate oxide film 34 of silicon oxide interposed therebetween.

In a MOS type semiconductor device of SOS structure according to this construction (hereinafter referred to as SOS/MOS for brevity), each element region 24 is separated from adjacent regions (not shown) by the insulating substrate 20 of sapphire and, the diffusion capacitance of the element region 24 is extremely low. Moreover, the capacitances of the diffusion wiring layers 26a and 26b and the general wiring capacitances are also extremely low. This allows high speed operation of the semiconductor elements. Since the semiconductor elements are insulated and separated from each other, a well diffusion layer need not be formed in the case of a CMOS semiconductor device. This prevents latch-up phenomenon from occurring even when the distance between the semiconductor elements is small. Since the diffusion wiring layers 26a and 26b are separated from the diffusion wiring layers of other semiconductor elements by insulators, punch-through phenomenon will not occur when the diffusion wiring layers are close to each other. The semiconductor elements may thus be formed at a high packaging density.

The SOS/MOS has the advantages as described above as well as the drawbacks to be described below. As may be seen in FIGS. 1 and 2, in an SOS/MOS a substrate electrode is not generally formed since it is hard to form. For this reason, in the case of a p-channel transistor as shown in FIGS. 1 and 2, for example, the potential at the n−-type region (hereinafter referred to as the substrate region) below the gate electrode 36 where the channel is to be formed is unstable, causing the so-called floating substrate effect in which the potential of the substrate region floats. This results in problems of characteristics to be described below. When a leakage current flows between the drain region 32 and the substrate region 28, charge is stored in the substrate region 28, and the substrate region 28 is forwardly biased with respect to the source region 30. As a result, the threshold voltage is lowered and the transistor may not be cut off. Furthermore, the voltage-current characteristics of the transistor involves the kink phenomenon, and abnormal current flows make the operation of the transistor unstable.

In the case of an n-channel transistor, the so-called charge pump phenomenon arises wherein the channel electrons are left in the substrate region when the transistor is cut off. A reverse bias is thus induced across the substrate region and the source region. The threshold voltage of the transistor is raised by the back gate bias effect caused by the reverse bias. Since the transconductance gm is lowered, the operation delay time tends to depend on the frequency.

In order to eliminate these drawbacks which may be caused in an SOS/MOS due to the floating substrate effect, an SOS/MOS, as shown in FIGS. 3 and 4, has been proposed wherein a substrate wiring layer 38 is formed to extend from the substrate region 28 in the direction of the channel width. A constant potential is supplied to the substrate region 28 through the substrate electrode formed in the substrate wiring layer 38. FIG. 3 is a plan view of a p-channel transistor in a conventional SOS/MOS with a substrate electrode, and FIG. 4 is a sectional view along the line IV—IV of FIG. 3. The substrate wiring layer 38 consists of n+-type silicon.

In a conventional SOS/MOS wherein the substrate electrode is formed as shown in FIG. 3, the gate electrode 36 terminates at a part slightly outside the end part of the element region 24 and the end part 40 of the gate electrode 36 is widened, so that the substrate wiring layer may be self-aligned using the gate electrode 36 as a mask. The width of the end part 40 of the gate electrode 36 is increased for the reasons to be described below.

The gate electrode 36 is patterned by photolithography. When an error is caused in the mask alignment, the gate electrode 36 is misaligned. Therefore, if the end part of the gate electrode is not widened, a gate electrode 36a as shown in FIG. 5 is formed. Thereafter, a p-type impurity such as boron is doped using the gate electrode 36a as a mask to form a p+-type source region 30a and a p+-type drain region 32a. Further, an n-type impurity such as phosphorus is doped to form an n+-type substrate wiring layer 38a. FIG. 6 shows an element region 24a and the substrate wiring layer 38a with the gate electrode 36a and the insulating layer being removed. The source region 30a and the drain region 32a formed by doping an impurity using the gate electrode 36a as a mask are of p+-type. On the other hand, since the n-type impurity is doped in the element region 24a before the formation of the source region 30a and the drain region 32a to render the element region n−-type, a substrate region 28a below the gate electrode 36a where the channel is to be formed is of n−-type. The substrate wiring layer 38a is of n+-type, as has already been described. When the gate electrode 36a is misaligned, the p+-type drain region 32a and the n+-type substrate wiring layer 38a form a direct junction at part A. Consequently, since the junction capacitance is significantly increased by the high concentration p+-n+ junction, the operation speed of the semiconductor element is lowered.

On the other hand, when an end part 40 of the gate electrode 36 is widened as shown in FIG. 3, the element region 24a and the substrate wiring layer 38a as shown in FIG. 7 are formed even when the gate electrode 36 is formed as misaligned. In this case, since the end part 40 of the gate electrode 36 is widened and is used as a mask when forming the p+-type source region 30a and the p+-type drain region 32a by doping an impurity, the misalignment in the gate electrode 36 does not result in formation of a direct junction between the p+-type drain region 32a and the n+-type substrate wiring layer 38a. Since the high concentration p+-n+ junction is not formed, a significant increase in the junction capacitance as described above may be prevented. Although the junction areas between the source region 30a and the substrate region 28a and between the drain region 32a and the substrate region 28a are widened, these junctions are p+-n− junctions. The capacitance in this case is much smaller than the junction capacitance of the high concentration p+-n+ junction as described above.

For the reasons described above, the end part 40 of the gate electrode 36 is widened in the conventional SOS/MOS wherein a substrate electrode is formed. However, widening of the end part 40 of the gate electrode 36 causes some problems as follows:

(1) Since the channel length L' of the element region 24a wherein the gate electrode is widened is longer than the channel length L of the element region wherein the gate electrode is not widened, the channel length is not constant throughout the entire element region. Thus, desired characteristics of the semiconductor elements may not be obtained.

(2) Since the area of the end part 40 of the gate electrode is made greater, the gate electrode capacitance is increased. The width (channel length) of the non-widened part of the gate electrode of an SOS/MOS of this type is generally about 2 μm. However, the width of the end part 40 of the gate electrode in this case is 8 to 10 μm. Therefore, the gate electrode capacitance increases due to the end part 40 to an extent which may be considerable.

(3) The widening of the end part 40 of the gate electrode increases the element area.

SUMMARY OF THE INVENTION

It is an object of the present invention to provide an improved MOS type semiconductor device which is formed on an insulating layer and which has a substrate electrode.

In order to achieve this object, there is provided according to the present invention a MOS type semiconductor device characterized in that to a substrate region of a first semiconductor layer formed on an insulating layer and for forming the MOS type element where a channel is to be formed, is connected a second semiconductor layer which is thinner than the first semiconductor layer and which has the same conductivity type as that of the substrate region at which the channel is to be formed.

With the structure as described above, the substrate electrode may be formed without widening the end part of the gate electrode. An increase in the junction capacitance due to the high concentration junction formed by the pattern misalignment of the gate electrode may also be prevented.

Furthermore, since the channel length may be made constant throughout the entire element region, stable and desired element characteristics may be obtained.

Since the area of the gate electrode need not be increased, the increase in the gate electrode capacitance and in the element area may be prevented.

Since the electrode wiring layer constituting the gate electrode need not be patterned to terminate at some point, a higher packaging density may be obtained.

BRIEF DESCRIPTION OF THE DRAWINGS

Other objects and advantages of the invention will become apparent from the following detailed description when taken in conjunction with the accompanying drawings in which:

FIG. 8 is a plan view showing an n-channel transistor of an SOS/MOS according to the present invention;

FIGS. 12A to 12G are sectional views of the semiconductor substrate of the SOS/MOS of FIG. 8 for showing the manufacturing process;

DETAILED DESCRIPTION OF THE PREFERRED EMBODIMENTS

Figure 1:
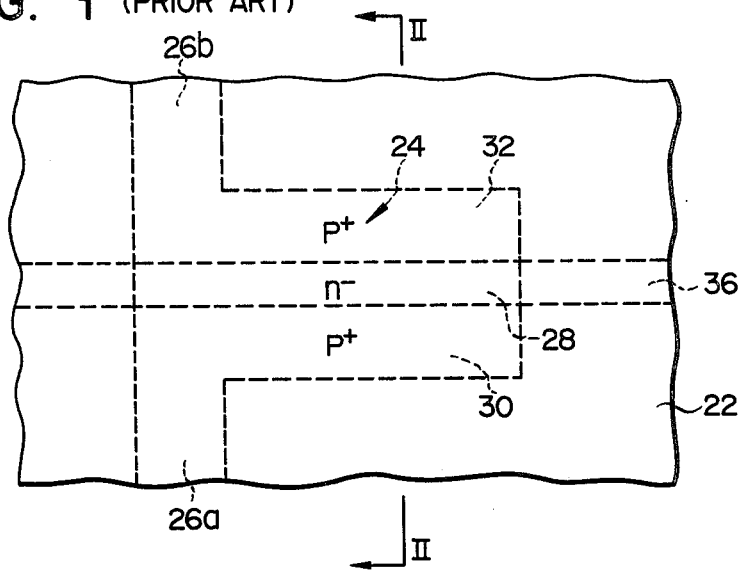
FIG. 1 is a plan view showing a p-channel transistor part of a conventional SOS/MOS.
Figure 2:
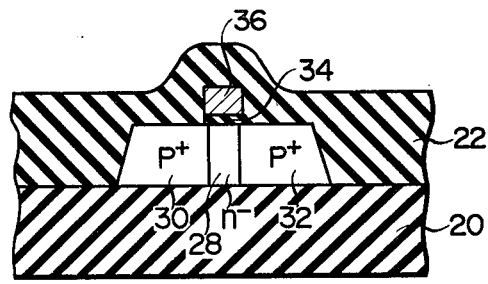
FIG. 2 is a sectional view of the SOS/MOS in FIG. 1 along the line II—II thereof.

The preferred embodiments of the SOS/MOS of the present invention will now be described with reference to FIGS. 8 to 11. FIG. 8 is a plan view of an n-channel transistor of an SOS/MOS.LSI according to the present invention. On a sapphire substrate 120 is formed an element region 124 of 0.6 μm thickness which comprises an island silicon layer. An n-channel transistor is formed in the element region 124. The element region 124 and its surrounding structure will be described referring to FIG. 9, which is a sectional view along the line IX—IX of FIG. 8. The element region 124 is covered with an insulation layer 122 consisting of $SiO_2$. The element region 124 consists of a p−-type substrate region 128 for forming a channel in which boron is doped to a concentration of $10^{16}/cm^3$; and an n+-type source region 130 and an n+-type drain region 132 in which arsenic is doped to a concentration of $10^{19}$ to $10^{20}/cm^3$. A gate electrode wiring 136 of polycrystalline silicon is formed on the substrate region 128 with a gate oxide film 134 of silicon oxide having a thickness of 500 Å interposed therebetween. The gate electrode wiring 136 constitutes the gate electrode of the MOS transistor. The gate electrode wiring 136 is covered by the insulation layer 122. On the insulation layer 122 are formed aluminum wirings 146 and 148 which form ohmic contacts with the source region 130 and the drain region 132 through contact holes 142 and 144 formed in the insulation layer 122, respectively.

As shown in FIG. 8, on the sapphire substrate 120 is formed a substrate wiring layer 138 of silicon, in addition to the element region 124. This substrate wiring layer 138 will be described with reference to FIG. 10 which is a sectional view of the SOS/MOS of FIG. 8 along the line X—X. The substrate wiring layer 138 comprises an island silicon layer 0.3 μm in thickness. Thus, the thickness of the substrate wiring layer 138 is half that of the element region 124, that is, half of 0.6 μm. Boron is doped in the substrate wiring layer 138 to a concentration of $10^{17}/cm^3$, which is lower than the impurity concentration $10^{19}$ to $10^{20}/cm^3$ of the source region 130 and the drain region 132 but is higher than the impurity concentration $10^{16}/cm^3$ of the substrate region 128. The substrate wiring layer 138 is of the same conductivity type as that of the substrate region but is higher in impurity concentration. However, the substrate wiring layer 138 is of opposite conductivity type to that of the source region 130 and the drain region 132 and is lower in impurity concentration than the source region 130 and the drain region 132. The substrate wiring layer 138 is formed integrally with the element region 124 to extend from the end face of the $p^-$-type substrate region 128 in the direction of the channel width. The substrate wiring layer 138 is covered with an insulation layer 122a of $SiO_2$. The gate electrode wiring 136 is formed on the substrate wiring layer 138 with this insulation layer 122a interposed therebetween. In this case, since the thickness of the element region 124 is 0.6 μm, the thickness of the gate oxide film 134 is 500 Å and the thickness of the substrate wiring layer 138 is 0.3 μm, the insulation layer 122a having a thickness of 0.35 μm, which is sufficient, is interposed between the substrate wiring layer 138 and the gate electrode wiring 136.

The substrate wiring layer 138 extends a certain length from the end face of the substrate region 128 along the direction of the channel width, and then extends along the direction of the channel length to form an L shape overall. The other end of the substrate wiring layer 138 is connected to a substrate terminal region 150 formed on the sapphire substrate 120. This structure will be described with reference to FIG. 11. The substrate terminal region 150 comprises an island silicon layer which is formed on the sapphire substrate 120 to be integral with the element region 124 and the substrate wiring layer 138. It has a thickness of 0.6 μm, which is the same as that of the element region 124. This substrate terminal region 150 is a $p^+$-type region containing boron at a concentration of $10^{19}$ to $10^{20}/cm^3$. The substrate terminal region 150 is covered with the insulation layer 122 described above. On the substrate terminal region 150 are also formed aluminum wirings (not shown) which form ohmic contacts through contact holes.

In the n-channel transistor of the SOS/MOS of the structure as described above, since a constant potential is supplied to the substrate region 128 through the substrate wiring layer 138, problems of the MOS transistor of the SOS structure which are associated with the floating substrate effect may not occur.

Figure 3:
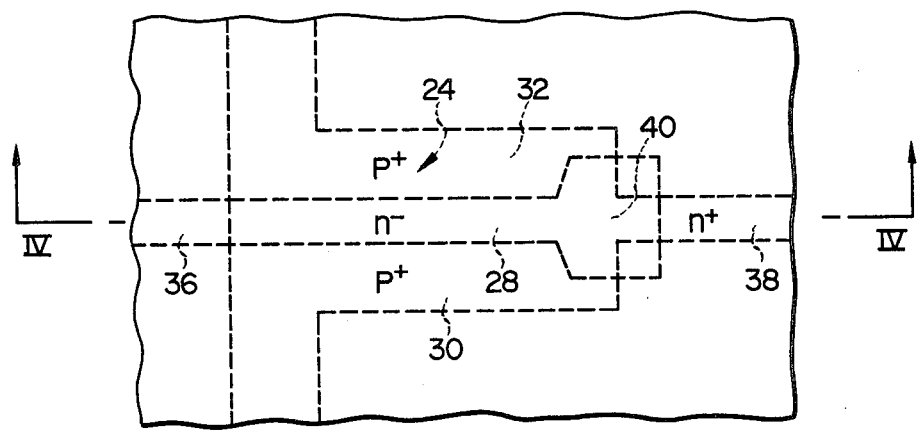
FIG. 3 is a plan view of a p-channel transistor part of another conventional SOS/MOS.
Figure 4:
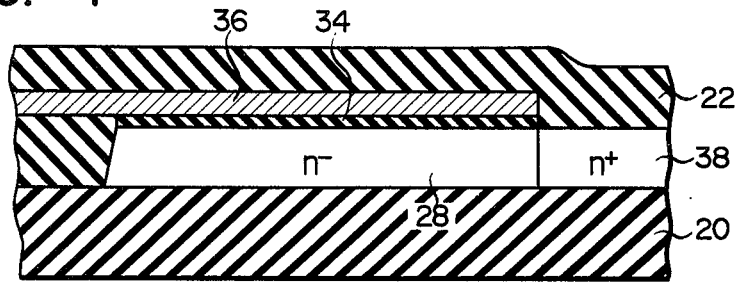
FIG. 4 is a sectional view of the SOS/MOS in FIG. 3 along the line IV—IV thereof.
Figure 5:
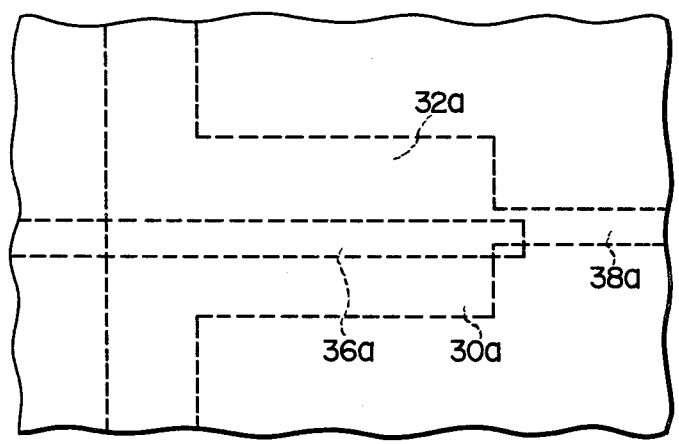
FIG. 5 is a plan view of a p-channel transistor part wherein a gate electrode whose end part is not widened is misaligned.
Figure 6:
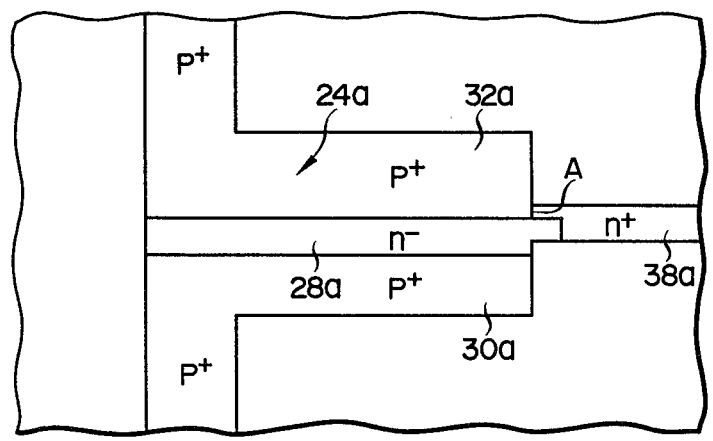
FIG. 6 is a plan view of the semiconductor substrate in FIG. 5 (with the gate electrode and the insulating layer being removed), in which an impurity is doped for forming source and drain regions.
Figure 7:
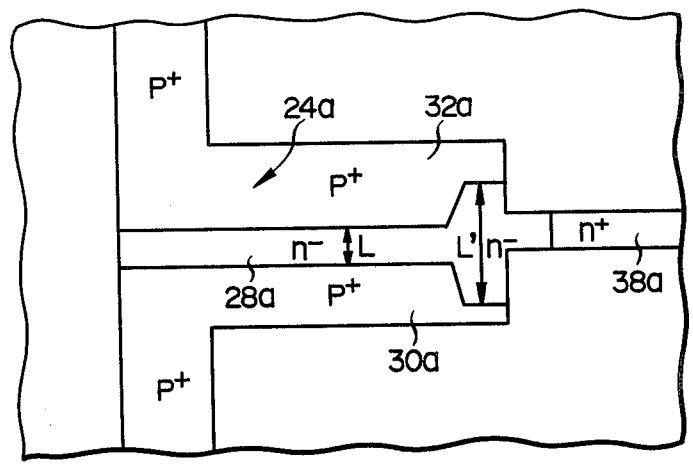
FIG. 7 is a plan view of the semiconductor substrate wherein a gate electrode whose end part is widened is misaligned.
Figure 9:
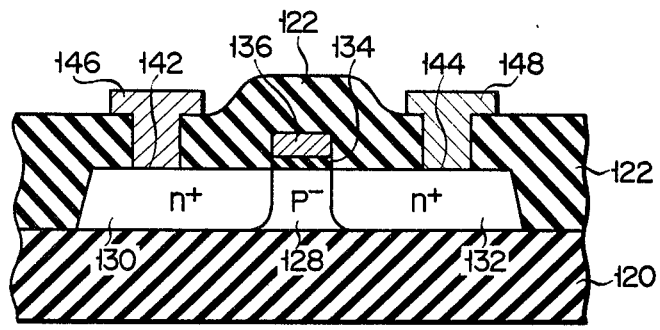
FIG. 9 is a sectional view of the SOS/MOS of FIG. 8 along the line IX—IX thereof.
Figure 10:
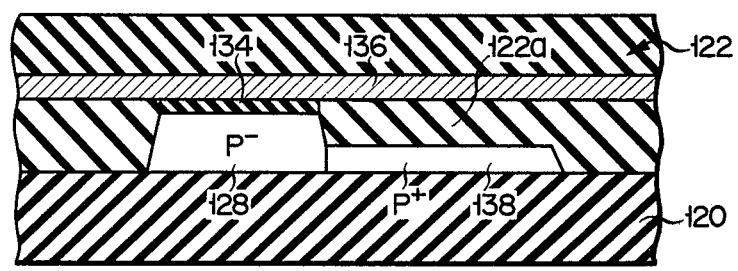
FIG. 10 is a sectional view of the SOS/MOS of FIG. 8 along the line X—X thereof.
Figure 11:
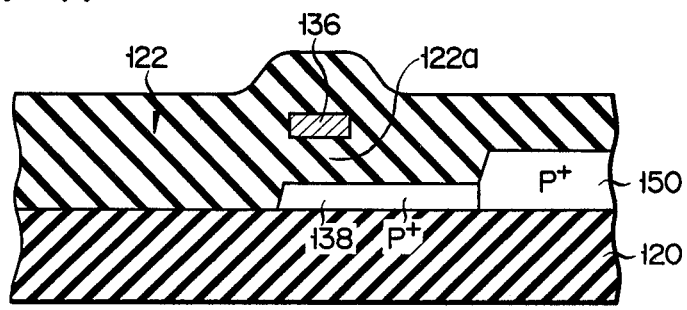
FIG. 11 is a sectional view of the SOS/MOS of FIG. 8 along the line XI—XI thereof.

The thickness of the substrate wiring layer 138 is made sufficiently less than that of the element region 124. Therefore, even if mask misalignment occurs during the formation of the gate electrode wiring 136, thus connecting the source region 130 or the drain region 132 to the substrate wiring layer 138, the increase in the junction capacitance is small due to the small junction area. Furthermore, since the impurity concentration of the substrate wiring layer 138 is smaller than that of the source region 130 or the drain region 132, the junction capacitance of the junction formed is small. Accordingly, since there is no need to widen the end part 40 of the gate electrode 36, unlike in the case of the conventional SOS/MOS as shown in FIG. 3, the channel length L may be made constant throughout the entire element region 124. As a result, desired characteristics of the semiconductor element may be obtained. Since the gate electrode may be formed in a general shape, an increase in the capacitance of the gate electrode may be avoided. Furthermore, the increase in the element area resulting from the widening of the gate electrode 36 may also be eliminated.

By making the substrate wiring layer 138 thin, the insulation layer 122a may be formed sufficiently thick on the substrate wiring layer 138. In this case, even if the gate electrode wiring 136 is formed extending from the gate electrode of the MOS transistor, the gate electrode capacitance between the substrate wiring layer 138 and the gate electrode wiring 136 is substantially negligible. For example, when the thickness of the substrate wiring layer 138 is made the same as that of the element region 124 and the gate electrode wiring 136 is formed parallel to the substrate wiring layer 138, the thickness of the insulation layer 122a becomes 500 Å which is the same as that of the gate oxide film 134. Since the thickness of the insulation layer 122a of this embodiment is 0.35 μm (3,500 Å), the gate electrode capacitance is (500/3500) (=1/7) that of the case described above. Therefore, it becomes possible to extend the gate electrode wiring 136 without terminating it at the end part of the element region 124 as in the case of the conventional SOS/MOS as shown in FIG. 3. It suffices that the thickness of the insulation layer 122a be formed such that the overall substrate wiring layer may not be depleted and an inversion layer may not be formed in the substrate wiring layer upon application of a voltage to the gate electrode wiring 136. Therefore, the thickness of the substrate wiring layer 138 and that of the insulation layer 122a may be selected depending upon the operating conditions of the semiconductor element, taking the points described above into consideration.

In the embodiment described above, the thickness of the substrate terminal region 150 is made the same as that of the element region 124 for the purpose of forming the aluminum wirings (not shown) in ohmic contact with the substrate terminal region 150 in the same process for forming the aluminum wirings 146 and 148 connected to the source region 130 and the drain region 132, respectively.

Figure 12E:
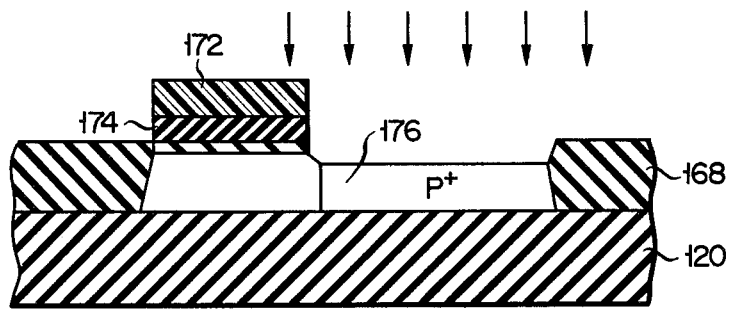

The method for manufacturing the SOS/MOS shown in FIGS. 8 to 11 will be described with reference to FIGS. 12A to 12G. As shown in FIG. 12A, a silicon layer 160 is epitaxially grown on the sapphire substrate 120 to a thickness of 0.6 μm. The surface of the silicon layer 160 is thermally oxidized to form an SiO₂ film 162 of 200 Å thickness. After forming a silicon nitride film on the entire surface of the semiconductor substrate, a resist pattern 164 is formed thereover. The silicon nitride film is selectively etched using this resist pattern 164 as a mask to form a silicon nitride pattern 166 in a region where the element region, the substrate wiring layer, and the substrate terminal region are to be formed.

Subsequently, as shown in FIG. 12B, the SiO₂ film 162 and the silicon layer 160 are selectively etched using the resist pattern 164 as a mask, to make the thickness of the unmasked part of the silicon layer 160 equal to 0.25 μm. Thereafter, the resist pattern 164 is removed.

As shown in FIG. 12C, the semiconductor substrate is then selectively oxidized in a water vapor atmosphere at 900° C. using the silicon nitride pattern 166 as an antioxidant mask. During this step, the unmasked part of the silicon layer 160 is oxidized to its boundary with the sapphire substrate 120 to form a field insulation film 168 having a thickness of about 0.6 μm. The silicon layer 160 surrounded by the field insulation film 168 becomes a silicon island 170.

As shown in FIG. 12D, a resist pattern 172 is then formed on the silicon nitride pattern 166, and the silicon nitride pattern 166 is selectively etched usng the resist pattern 172 as a mask, to form a silicon nitride pattern 174 which remains only on the element region and the substrate terminal region.

Then, as shown in FIG. 12E, the SiO₂ film 162 and the silicon island 170 are selectively etched using the resist pattern 172 as a mask to make the thickness of the unmasked part of the silicon island 170 where the substrate wiring layer is to be formed about 0.45 μm. Thereafter, boron with dose of $5 \times 10^{12}/cm^{-2}$ is ion-implanted using the resist pattern 172 as a mask. The ion-implanted part 176 of the silicon island 170 is activated by a subsequent annealing step to give it p⁺-type conductivity.

Figure 12F:
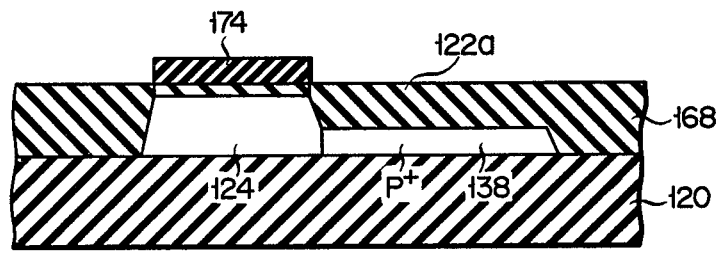

As shown in FIG. 12F, after removing the resist pattern 172, the ion-implanted part 176, that is, the p⁺-type region 176 of the silicon island 170 is selectively oxidized in a water vapor atmosphere at 900° C. using the silicon nitride pattern 174 as an antioxidant mask. As a result, the substrate wiring layer 138 of 0.3 μm thickness is formed, and a field insulation film 122a of 0.35 μm thickness of SiO₂ is formed on the substrate wiring layer 138. The part of the silicon island other than the substrate wiring layer 138 provides the element region 124 of 0.6 μm thickness and the substrate terminal region (not shown) of 0.6 μm thickness connected to the substrate wiring layer 138.

Figure 12G:
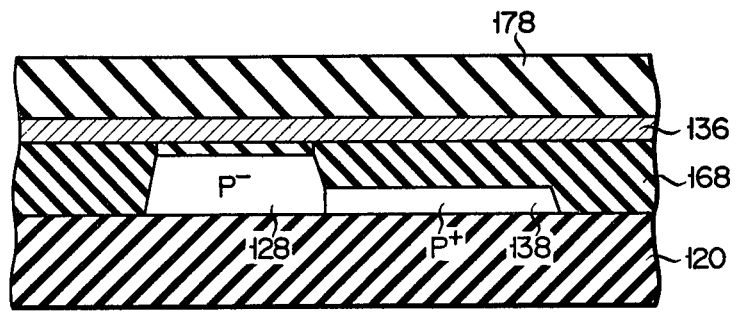

Finally, as shown in FIG. 12G, after removing the silicon nitride pattern 174, boron is ion-implanted in the element region 124 to make this region into a p⁻-type region containing an impurity of low concentration. Boron is also ion-implanted to a high concentration in the substrate terminal region (not shown) to make this region a p⁺-type region. Subsequently, according to the general method, the gate electrode wiring 136 is formed on the substrate wiring layer 138 and the part of the element region 124 where the substrate region is to be formed. Arsenic is then doped using the gate electrode wiring 136 as a mask to form the n⁺-type source region and the n⁺-type drain region. The area of the element region 124 masked by the gate electrode wiring 136 becomes the substrate region 128. Then, a CVD-SiO₂ layer 178 is deposited. Contact holes are formed and an aluminum layer is deposited by vacuum evaporation. The aluminum layer is patterned to form aluminum wirings to complete the SOS/MOS.

When the SOS/MOS has the structure as described above, the element region 124, the substrate wiring layer 138, and the substrate terminal region may be formed by self alignment from a single silicon island. Furthermore, since the field insulation film 122a is thick, a mask need not to be formed on the field insulation layer 122a for forming the source region and the drain region in the element region 124.

Figure 13:
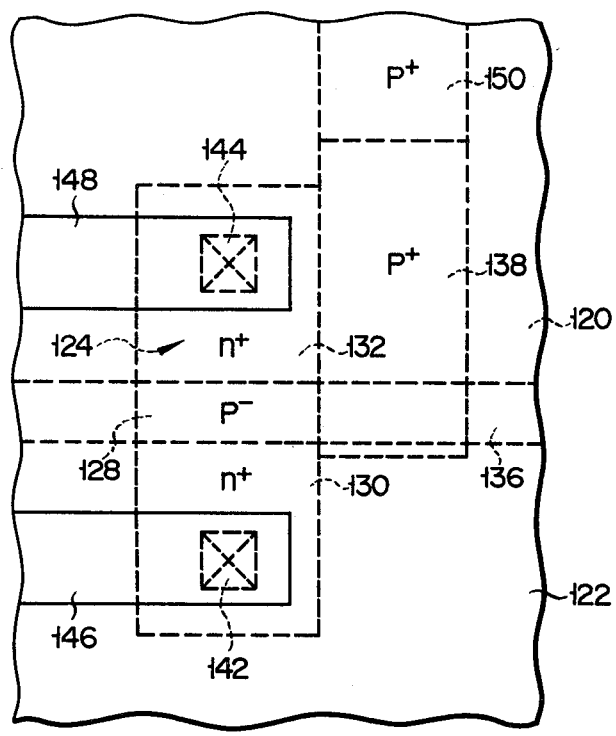
FIG. 13 is a plan view of an n-channel transistor part of another SOS/MOS according to the present invention.

Another embodiment of the SOS/MOS of the present invention will be described with reference to FIG. 13. On the sapphire substrate 120 is formed the element region 124 consisting of the n⁺-type source region 130, the n⁺-type drain region 132 and the p⁻-type substrate region 128 where the channel is to be formed. The source region 130 is connected to the aluminum wiring 146 through the contact hole 142. The drain region 132 is connected to the aluminum wiring 148 through the contact hole 144. The substrate region 128 is connected to the p⁺-type substrate wiring layer 138 which is thinner than the element region 124. The substrate wiring layer 138 extends in the direction of the channel length and is contiguous with one side surface of the n⁺-type drain region 132. The substrate wiring layer 138 is also contiguous with the source region 130 over a small area. The substrate wiring layer 138 is connected to the p⁺-type substrate terminal region 150 having the same thickness as that of the element region 124. This substrate terminal region 150 is formed as separated from the drain region 132 containing an impurity doped to a high concentration, so as not to be contiguous with this drain region 132. The gate electrode wiring 136 is formed on the substrate region 128 and the substrate wiring layer 138 with the insulator layer interposed therebetween.

Although p⁺-n⁺ junctions of high concentration are formed at the boundaries between the substrate wiring layer 138, and the source region 130 and the drain region 132, respectively, the junction areas are small since the thickness of the substrate wiring layer 138 is sufficiently small. Therefore, the junction capacitance is small and imposes no problem. The junction capacitance may be further reduced by making the impurity concentration in the substrate wiring layer 138 higher than that of the substrate region 128 but lower than that of the drain region 132 or the source region 130.

Although the above embodiment has been described with reference to the n-channel MOS transistor, the present invention is similarly applicable to a p-channel transistor or an n-channel or p-channel MOS switching capacitor.

An insulating substrate other than a sapphire substrate may similarly be used. The present invention is also applicable to the case where an MOS semiconductor element is formed on an insulating layer of SiO₂ or Si₃N₄, for example, formed on the semiconductor substrate.

Figure 14:
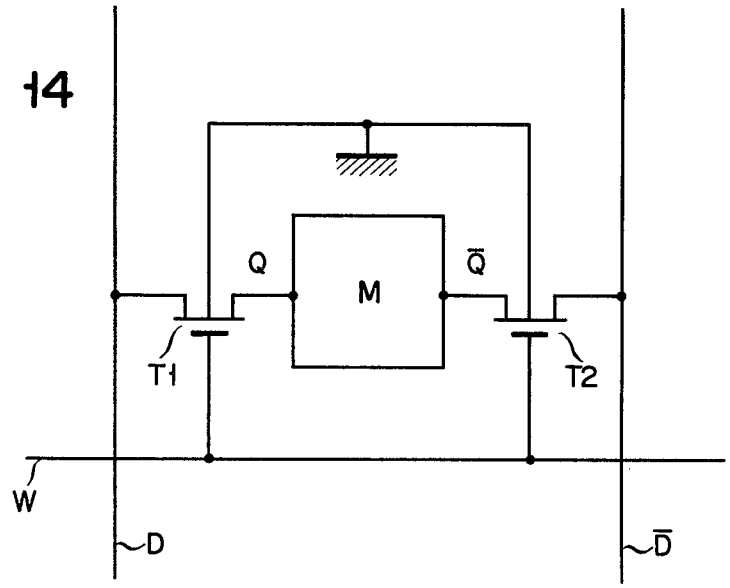
FIG. 14 is a circuit diagram of an SOS/MOS.IC which is an application of the SOS/MOS of the present invention.

An actual application of the MOS type semiconductor device according to the present invention will now be described with reference to FIG. 14. A memory node Q of a memory cell M comprising a flip-flop circuit is connected to a digit line D through a data transfer transistor T1. A memory node $\overline{Q}$ of the memory cell M is connected to a digit line $\overline{D}$ through a data transfer transistor T2. The gates of the data transfer transistors T1 and T2 are connected to a word line W, and the substrate regions of the data transfer transistors T1 and T2 are both grounded.

Since the substrate potential of the data transfer transistors T1 and T2 is constant with this configuration, the floating substrate effect of the data transfer transistors T1 and T2 may be prevented.

This prevents fluctuations in the output level of the transistors T1 and T2 due to the hysterisis of the transistors T1 and T2. Furthermore, according to the present invention, the increase in the element area when forming the substrate electrodes of the transistors T1 and T2 may be reduced to the minimum. The increase in the number of memory cell arrays and in the wiring capacitance of the word line W may also be reduced to the minimum. By grounding the substrate potential of the transistors T1 and T2, a significant increase in the electrostatic capacity of the digit line due to the floating substrate effect of the data transfer transistors T1 and T2 may be prevented.

What is claimed is:

1. A MOS type semiconductor device comprising:
   an insulating layer;
   a MOS type element including a first semiconductor layer formed on said insulating layer, said semiconductor layer having a substrate region of one conductivity type in which a channel is formed and further having an impurity region of an opposite conductivity type which is completely divided by said substrate region, said MOS type element further including an electrode formed on said first semiconductor layer with a first insulation film interposed therebetween; and
   a second semiconductor layer formed on said insulating layer alongside said first semiconductor layer, said second semiconductor layer having a smaller height than said first semiconductor layer as measured from the surface of said insulating layer, said second semiconductor layer being of the same conductivity type as said substrate region and being connected to at least said channel of said substrate region at an end of said channel which is exposed intermediate said divided impurity region, said substrate region being adapted to receive a constant potential supplied through said second semiconductor layer.

2. A MOS type semiconductor device according to claim 1, wherein said second semiconductor layer has an impurity concentration higher than the impurity concentration of said substrate region of said first semiconductor layer where said channel is formed but lower than the impurity concentration of said impurity region of said first semiconductor layer.

3. A MOS type semiconductor device according to claim 1 or 2, wherein the electrode of said MOS type element extends over said second semiconductor layer with a second insulation film interposed therebetween; and
   said second insulation film has a thickness such that the entirety of said second semiconductor layer remains undepleted or an inversion layer is not formed therein when an operating voltage is applied to said electrode of said MOS type element.

4. A MOS type semiconductor device according to claim 1 or 2, wherein said first and second semiconductor layers are surrounded by an insulator to form an island.

5. A MOS type semiconductor device according to claim 3, wherein said first and second semiconductor layers are surrounded by an insulator to form an island.

6. A MOS type semiconductor device according to claim 1 or 2, wherein a dimension of said second semiconductor layer, as measured along a longitudinal axis extending from the border of said first and said second semiconductor layers, is greater than the transverse dimension of said channel of said substrate region.

7. A MOS type semiconductor device according to claim 3, wherein a dimension of said second semiconductor layer, as measured along a longitudinal axis extending from the border of said first and said second semiconductor layers, is greater than the transverse dimension of said channel of said substrate region.

8. A MOS type semiconductor device according to claim 4, wherein a dimension of said second semiconductor layer, as measured along a longitudinal axis extending from the border of said first and said second semiconductor layers, is greater than the transverse dimension of said channel of said substrate region.

9. A MOS type semiconductor device according to claim 5 wherein a dimension of said second semiconductor layer, as measured along a longitudinal axis extending from the border of said first and second semiconductor layers, is greater than the transverse dimension of said channel of said substrate region.

10. A MOS type semiconductor device according to claim 1 or 2, wherein said MOS type element is a MOS transistor with said divided impurity region of said first semiconductor layer comprising a source region and a drain region thereof.

11. A MOS type semiconductor device according to claim 3, wherein said MOS type element is a MOS transistor with said divided impurity region of said first semiconductor layer comprising a source region and a drain region thereof.

12. A MOS type semiconductor device according to claim 4, wherein said MOS type element is a MOS transistor with said divided impurity region of said first semiconductor layer as a source region and a drain region thereof.

13. A MOS type semiconductor device according to claim 5, wherein said MOS type element is a MOS transistor with said divided impurity region of said first semiconductor layer comprising a source region and a drain region thereof.

14. A MOS type semiconductor device according to claim 6, wherein said MOS type element is a MOS transistor with said divided impurity region of said first semiconductor layer comprising a source region and a drain region thereof.

15. A MOS type semiconductor device according to claim 7, wherein said MOS type element is a MOS transistor with said divided impurity region of said first semiconductor layer comprising a source region and a drain region thereof.

16. A MOS type semiconductor device according to claim 8, wherein said MOS type element is a MOS transistor with said divided impurity region of said first semiconductor layer comprising a source region and a drain region thereof.

17. A MOS type semiconductor device according to claim 9, wherein said MOS type element is a MOS transistor with said divided impurity region of said first semiconductor layer comprising a source region and a drain region thereof.

* * * * *